US006825718B2

(12) United States Patent
Kang et al.

(10) Patent No.: US 6,825,718 B2
(45) Date of Patent: Nov. 30, 2004

(54) IMPEDANCE MATCHING CIRCUIT (75) Inventors: Tzung-Hung Kang, Hsinchu (TW); Chao-Cheng Lee, TaoYuan (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 10/464,489

(22) Filed: Jun. 19, 2003

(65) Prior Publication Data

US 2003/0234686 A1 Dec. 25, 2003

(30) Foreign Application Priority Data

Jun. 21, 2002 (TW) .......................................... 91113566

(51) Int. Cl.$^7$ ................................................ H03F 1/36
(52) U.S. Cl. ......................................... 330/86; 330/103
(58) Field of Search .................................. 330/86, 103

(56) References Cited

U.S. PATENT DOCUMENTS 3,562,552 A  * 2/1971 Baudino et al. ............. 327/349
5,585,741 A  * 12/1996 Jordan .......................... 326/30
6,278,339 B2    8/2001 Abadeer et al.
6,621,346 B1 * 9/2003 Nabicht et al. ............. 330/284
6,665,525 B2 * 12/2003 Dent et al. ................... 455/108

* cited by examiner

Primary Examiner—Patricia Nguyen
(74) Attorney, Agent, or Firm—Troxell Law Office PLLC (57) ABSTRACT

The present invention discloses an impedance matching circuit which is suitable to be applied on an IC chip. The impedance matching circuit comprises a resistor unit, an OP amplifier circuit connected with the resistor unit, a feedback selecting circuit connected in parallel with the OP amplifier circuit, and a resistor selecting circuit connected with both the OP amplifier circuit and the feedback selecting circuit. The feedback selecting circuit further includes a plurality of switching circuits for enabling some of the resistors furnished in the resistor selecting circuit. By selecting and actuating one of the switching circuits, some certain resistors will be enabled so as to adjust the resistance value of the resistor selecting circuit. The resistor unit and the switching circuits are designed in such a manner that the resistor unit is able to compensate an equivalent resistance of the switching circuit which is actuated. As a result, the impedance of the whole impedance matching circuit is precisely matching with the adjusted resistance value of the resistor selecting circuit and will not be influenced by any variation of the input signals.

20 Claims, 5 Drawing Sheets

IMPEDANCE MATCHING CIRCUIT

FIELD OF THE INVENTION

The invention relates to an impedance matching circuit and, more particularly, to an impedance matching circuit which is suitable to be applied on an IC chip for adjusting impedance variation caused by the transistors of the impedance matching circuit.

BACKGROUND OF THE INVENTION

In a cable communicating system, impedance matching circuit is necessary to be implemented in the cabling interface of a communicating device for reducing or eliminating signal reflections caused by unmatched impedances between the cable and the circuits inside the communicating device.

Figure 1:
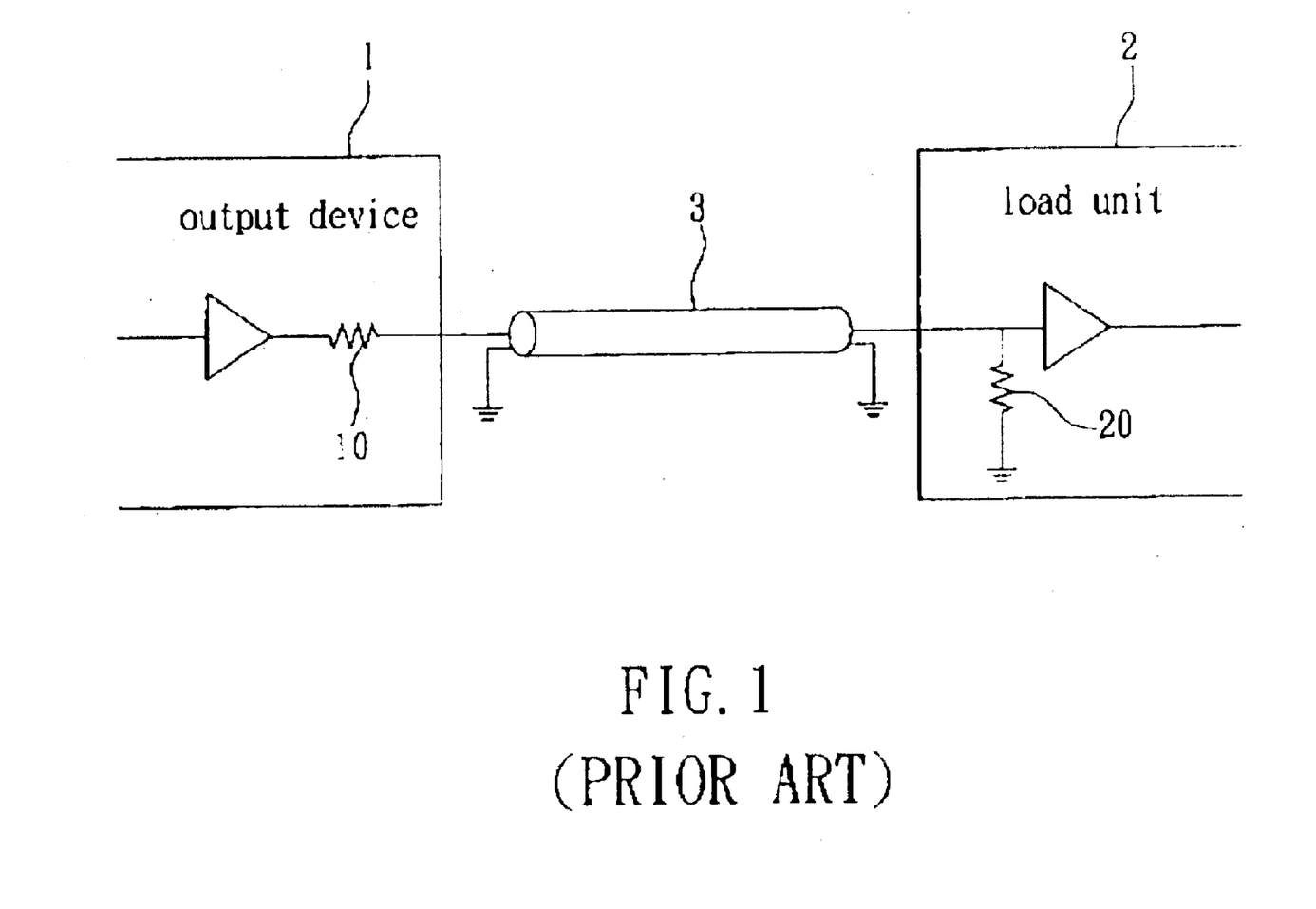
FIG. 1 is the schematic drawing illustrating the basic principle of the impedance matching of prior art.

FIG. 1 is a schematic drawing illustrating the basic principle of the impedance matching of prior art. As shown, the output device 1 outputs a signal to drive a load unit 2 via a cable 3. In order to accomplish the object of impedance matching, the characteristic impedance of the cable has to match the impedances of the inside circuits of both the output device 1 and the load unit 2. Otherwise, signal reflections may occur. For example, if the output resistor 10 of the output device 1 is 50 Ω, then the impedance of the cable 3 must be 50 Ω, and the input resistor 20 of the load unit 2 must be 50 Ω as well.

Generally, the values of resistances of the circuits built-in an IC (Integrated Circuit) chip are variable due to the inevitable deviations of semiconductor manufacturing processes. It is relatively difficult to precisely control the resistance of the IC chip for the purpose of impedance matching. Therefore, the conventional way is to apply a precision resistor outside the IC chip to achieve the object of impedance matching. However, the drawback of this prior art technique is the increases of the complexity of circuit design, the usage of electronic components, and the cost.

Because it is relatively difficult to design a linear resistor (for example, by using poly N-wells) with precise resistance inside an IC chip, another conventional way is to apply an adjustable resistor circuit inside the IC chip to compensate the variation of the resistance of the IC chip caused by semiconductor manufacturing processes.

Figure 2:
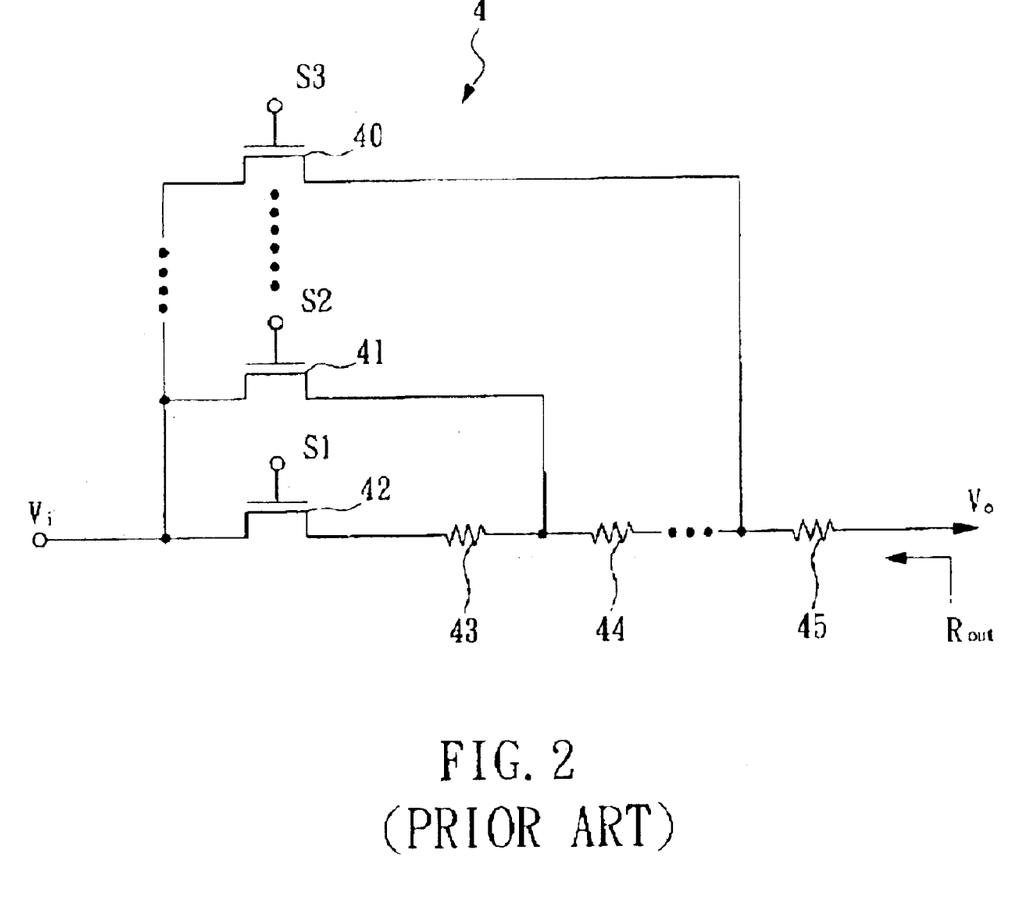
FIG. 2 is a schematic diagram showing an on-chip impedance matching circuit of prior art.

FIG. 2 is a schematic diagram showing an on-chip impedance matching circuit of prior art. As shown in FIG. 2, the impedance matching circuit 4 includes a plurality of MOS transistors 40, 41, 42. These MOS transistors 40, 41, 42 are controlled by providing switching voltages to the gates S1, S2, S3 respectively so as to determinate whether these transistors are switched on or not. For example, if the gate S2 is provided with a switching voltage, the MOS transistor 41 will be switched on, and the resistance value of the output resistor (Rout) will be equal to the sum of the values of the resistors from the resistor 44 through the resistor 45. However, there is still a serious problem in such design.

Figure 3:
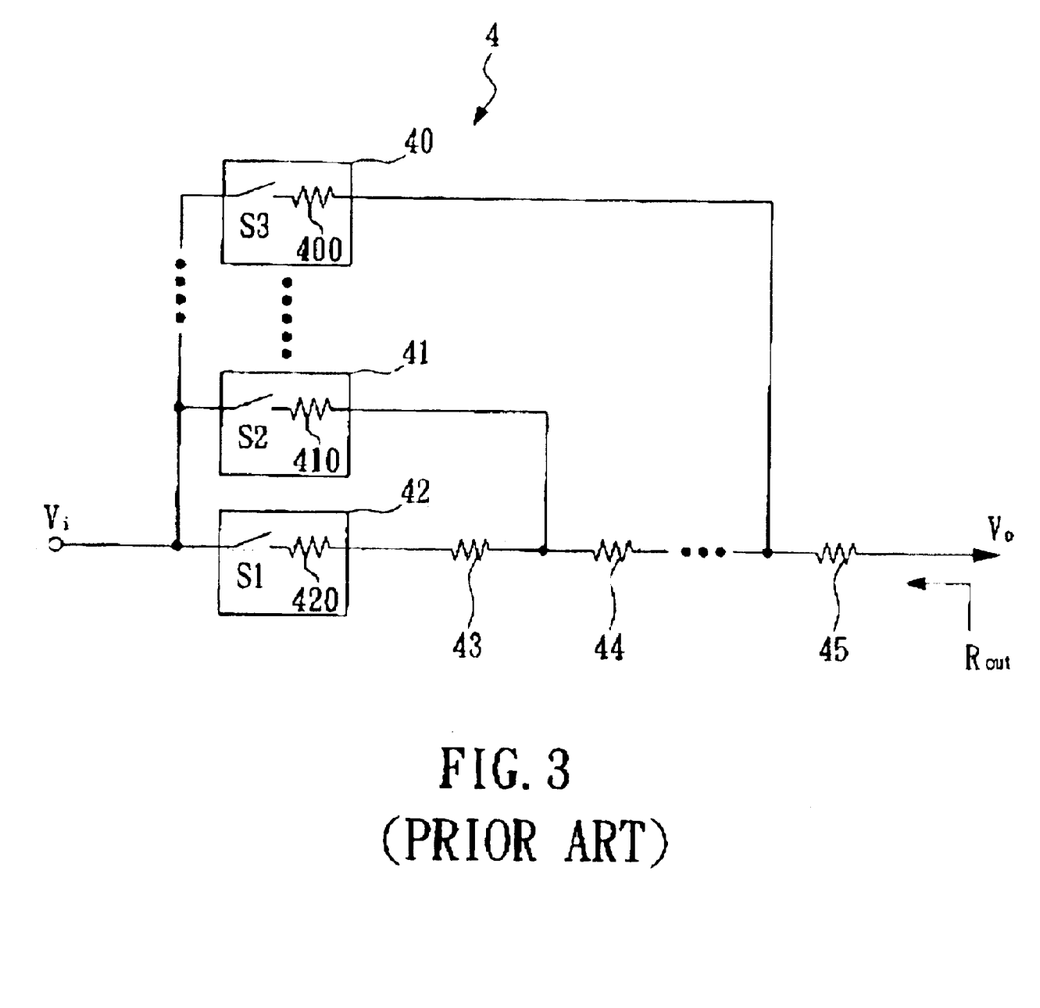
FIG. 3 is a schematic diagram showing the circuits of the interior resistors 400, 410, 420 of the MOS transistors 40, 41, 42 of FIG. 2.

FIG. 3 is a schematic diagram showing the circuits of the interior resistors 400, 410, 420 of the MOS transistors 40, 41, 42 of FIG. 2. As previously described in FIG. 2, when one of the MOS transistors 40, 41, 42 is switched on, then a resistance will also be generated inside that MOS transistor. These inevitable resistances caused by switching on these MOS transistors 40, 41, 42 can be schematically represented by the interior resistors 400, 410, 420 respectively. That is, When the MOS transistor 41 is switched on, i.e. S2 is short, the output resistor value (Rout) is actually equal to the sum of resistors 44 through 45, and 410. Therefore, when designing an on-chip impedance matching circuit, not only the resistors 43, 44, 45 should be calculated, but also the interior resistors 400, 410, 420 must be considered. Moreover, the values of such interior resistors 400, 410, 420 are variable by applying different values of input voltage $V_i$, which will distort the output signals and impede the functions of the IC chip.

SUMMARY OF THE INVENTION

The first object of the present invention is to provide an impedance matching circuit which is suitable to be applied on an IC chip for adjusting impedance variation of the transistors formed on the IC chip.

The second object of the present invention is to provide an impedance matching circuit which comprises a resistor unit and an operational amplifier. By utilizing the ideal characteristic of the operational amplifier, the variations of the interior resistors caused by the transistors can be eliminated, and thus the resistance of the impedance matching circuit can be precisely controlled and selected.

In an embodiment of the impedance matching circuit in accordance with the present invention, the impedance matching circuit comprises a resistor unit, an OP amplifier circuit connected with the resistor unit, a feedback selecting circuit connected in parallel with the OP amplifier circuit, and a resistor selecting circuit connected with both the OP amplifier circuit and the feedback selecting circuit. The feedback selecting circuit further includes a plurality of switching circuits for enabling some of the resistors furnished in the resistor selecting circuit. By selecting and actuating one of the switching circuits, some certain resistors will be enabled so as to adjust the resistance value of the resistor selecting circuit. The resistor unit and the switching circuits are designed in such a manner that the resistor unit is able to compensate an equivalent resistance of the switching circuit which is actuated. As a result, the impedance of the whole impedance matching circuit is precisely matching with the adjusted resistance value of the resistor selecting circuit and will not be influenced by any variation of the input signals.

Other and her features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention is to provide an impedance matching circuit and, more particularly, to provide an impedance matching circuit which is suitable to be applied on an IC chip. The concept of the present invention is to provide an on-chip operational amplifier which is connected in parallel with the transistors of the impedance matching circuit. In addition, an additional resistor unit having a transistor built therein is connected to the operational amplifier. By utilizing the ideal characteristic of the operational amplifier, the variations of the interior resistors caused by the transistors can be eliminated, and thus the resistance of the impedance matching circuit can be precisely controlled and selected.

Figure 4:
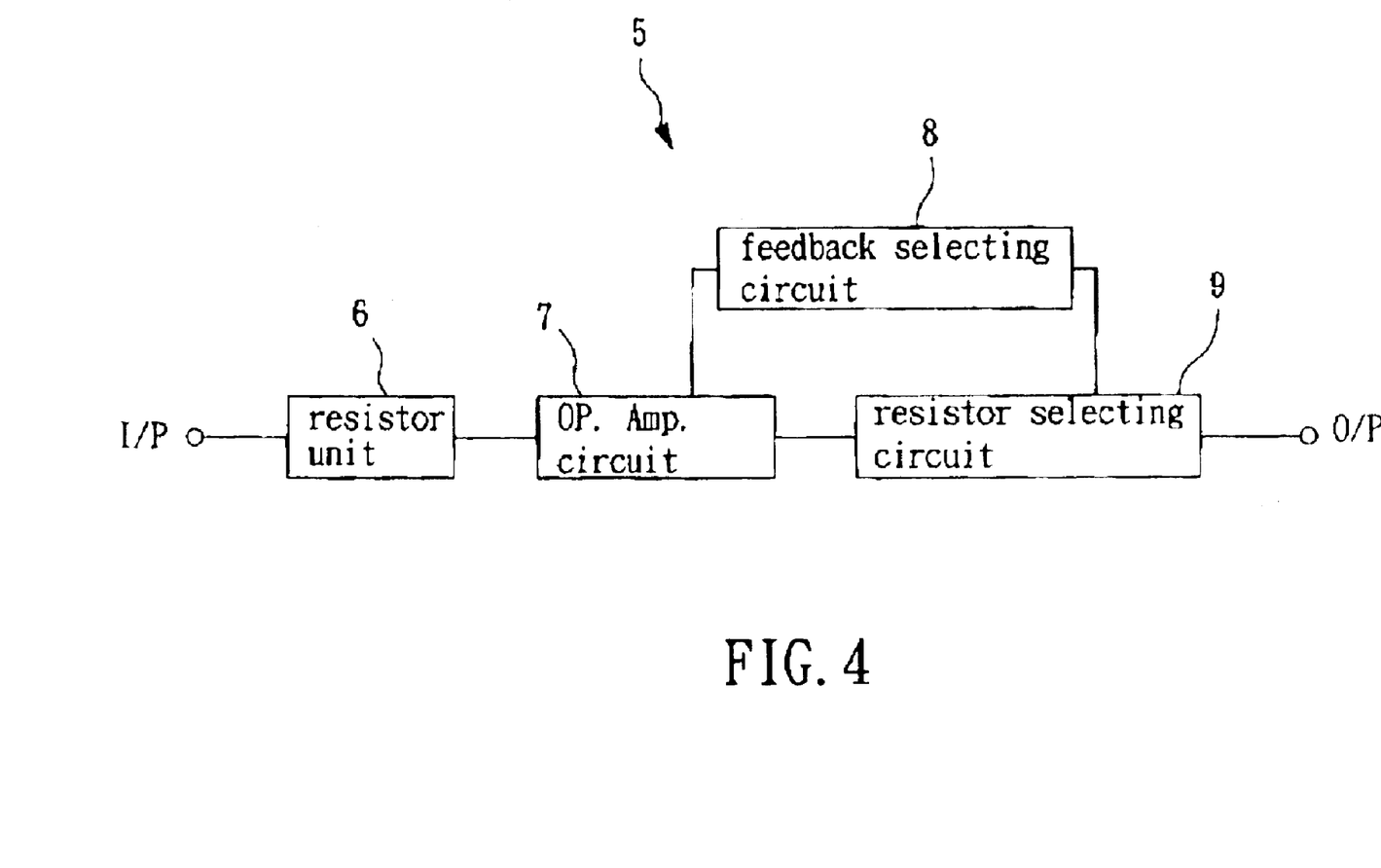
FIG. 4 is a block diagram schematically showing an embodiment of the impedance matching circuit in accordance with the present invention.

FIG. 4 is a block diagram schematically showing an embodiment of the impedance matching circuit in accordance with the present invention. As shown in FIG. 4, the impedance matching circuit 5 of the present invention is formed on an IC chip by semiconductor manufacturing processes (i.e., so called on-chip impedance matching circuit). The on-chip impedance matching circuit 5 comprises a resistor unit 6, an OP amplifier circuit 7, a feedback selecting circuit 8, and a resistor selecting circuit 9. The resistor unit 6 is used to accept an input signal (I/P) which can also be referred as the input voltage ($V_i$, not shown in this figure) hereafter. A control voltage $V_{DD}$ (not shown in this figure) is also applied to the resistor unit 6 for controlling the operation of the OP amplifier circuit 7. The primary function provided by the resistor unit 6 and the OP amplifier circuit 7 in the present invention is to compensate the variation of resistance of the feedback selecting circuit 8 caused by either the variation of the input voltage or the semiconductor manufacturing processes. The feedback selecting circuit 8 accepts at least one control signal and enables some of the resistors of the resistor selecting circuit 9 according to the control signal, so as to decide the resistance value of the resistor selecting circuit 9. Therefore, the resistance value of the resistor selecting circuit 9 of the present invention is adjustable and predetermined by applying some certain control signals to the feedback selecting circuit 8 so as to accomplish the object of the impedance matching of the IC chip. In addition, since the application of the resistor unit 6 and the OP amplifier circuit 7 compensates the variation of resistance of the feedback selecting circuit 8, the impedance matching circuit 5 of the present invention can be built in the IC chip without suffering the drawbacks of signal distortion nor function obstruction caused by the variation of input signal (1/P) as which otherwise might happen in the aforementioned prior art.

Figure 5:
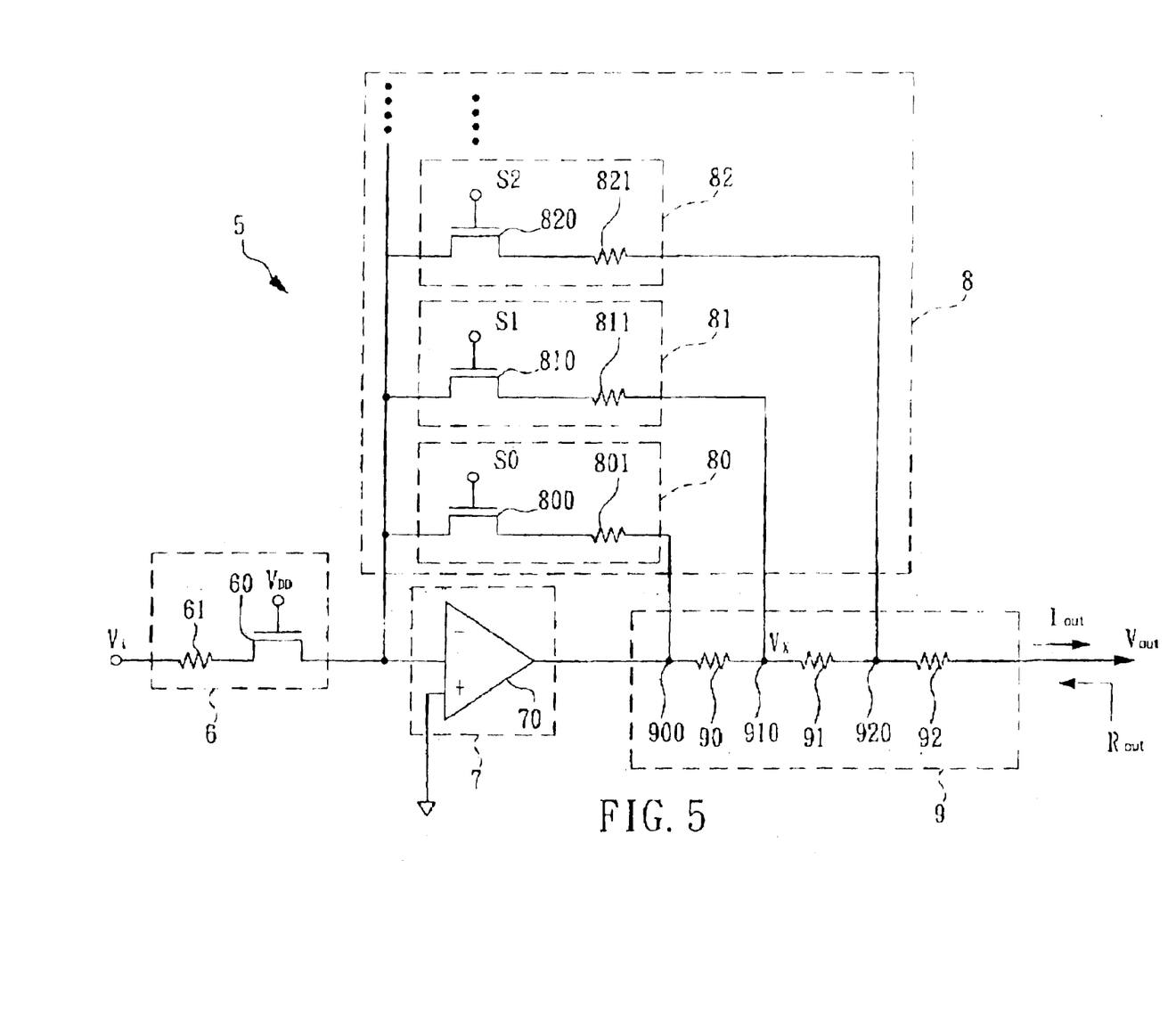
FIG. 5 is a schematic diagram showing a preferred embodiment of the circuit design of the impedance matching circuit 5 illustrated in FIG. 4.

FIG. 5 is a schematic diagram showing a preferred embodiment of the circuit design of the impedance matching circuit 5 illustrated in FIG. 4. As shown in FIG. 5, the resistor unit 6 comprises a resistor 61 and a MOS transistor 60 which is serially connected to the resistor 61. The OP amplifier circuit 7 includes an OP amplifier 70. The OP amplifier 70 is connected in serial between the resistor unit 6 and the resistor selecting circuit 9 and is also connected in parallel with the feedback selecting circuit 8. The feedback selecting circuit 8 comprises a plurality of switching circuits 80, 81, 82 connected in parallel with each other. Each of the switching circuits 80, 81, 82 further includes a MOS transistor and a resistor connected in serial. That is, the MOS transistors 800, 810, 820 and resistors 801, 811, 821 respectively. The resistor selecting circuit 9 comprises a plurality of resistors 90, 91, 92 connected in serial. There is a plurality of nodes 900, 910, 920 located between the resistors 90, 91, 92 (or located in front of each of the resistors) for connecting to the switching circuits 80, 81, 82 respectively. For example, the node 900 is located in front of the resistor 90 and is connected to the switching circuit 80. The node 910 is located between the resistors 90 and 91 and is connected to the switching circuit 811, and so on.

The OP amplifier 70 has an inverting input terminal, a non-inverting input terminal, and an output terminal. The gate of the MOS transistor 60 is connected to and controlled by the control voltage $V_{DD}$, while the drain of the MOS transistor 60 is connected to the inverting input terminal of the OP amplifier 70. And, the source of the MOS transistor 60 is connected to the resistor 61 which is further connected to an exterior device (not shown) for accepting the input voltage ($V_i$). The switching (conductive) status of the MOS transistor 60 can be controlled by the control voltage $V_{DD}$.

The sources of the MOS transistors 800, 810, 820 are all connected to the inverting input terminal of the OP amplifier 70. The gates of the MOS transistors 800, 810, 820 are connected to and controlled by the control voltages S0, S1, S2 respectively. And, the drains of the MOS transistors 800, 810, 820 are connected to the resistors 801, 811, 821 respectively and then further connected to the nodes 900, 910, 920 of the resistor selecting circuit 9 as previously described.

The input end of the resistor selecting circuit 9 is connected to the output terminal of the OP amplifier 70. The output end of the resistor selecting circuit 9 outputs an output signal with the current $I_{out}$ and the voltage $V_{out}$. The overall resistance of the resistor selecting circuit 9 is controlled by the feedback selecting circuit 8 and is equal to the impedance of the whole impedance matching circuit 5. In a preferred embodiment of the present invention, the a mount of the resistors of the resistor selecting circuit 9 is equal to the amount of the s witching circuits oft he feedback selecting circuit 8.

Because the MOS transistor 60 of the resistor unit 6 and the MOS transistors 800, 810, 820 of the feedback selecting circuit 8 are manufactured by the same semiconductor manufacturing processes and should have the same electric characters, therefore they should also have the same resistance value under the same control voltage and input voltage. Supposing the OP amplifier 70 is an ideal amplifier and the values of resistors 801, 811, 821 and 61 are all equal. When one of the MOS transistors 800, 810, 820 is switched on, for example the MOS transistor 810 is switched on, then the electric current that passes through the resistor 61 as well as the MOS transistor 60 will be exactly equal to the electric current that passes through the resistor 811 and the MOS transistor 810. Moreover, the resistance values of the MOS transistors 60 and 810 are equal to each other. So, we can get $V_x = -V_i$. To calculate the output/input impedance of $V_{out}$, we can assume $V_i = 0V$, then $$V_x = -V_i = 0V$$

The output current Iout is what passes through the resistors 91, 92 to $V_x$ (0V), so $$R_{out} = (V_{out} - V_x)/I_{out} = \text{resistor } 91 + \text{resistor } 92$$

From the above equations, it can be seen that the impedance of the whole impedance matching circuit 5 is exactly equal to the resistance value "resistor 91+resistor 92" of the resistor selecting circuit 9. The influence of the variation of the input voltage ($V_i$) and the semiconductor manufacturing processes of the transistors are both eliminated.

Similarly, when the transistor 800 is switched on, the impedance of the impedance matching circuit 5 will be equal to the sum of the resistor 90, resistor 91, and resistor 92.

And, when the transistor 820 is switched on, the impedance is resistor 92. Therefore, by providing/controlling some certain control voltages S0, S1, S2 to the corresponding control transistors 800, 810, 820, the input/output resistance value (impedance) can be precisely controlled. Moreover, the resistance value (impedance) of the impedance matching circuit 5 is only depended on the values of resistors 90, 91, 92, and is independent from the electric characters of the transistors. Therefore, the actual impedance of the impedance matching circuit 5 can exactly match what we expect when designing it. As a result, the impedance matching circuit 5 of the present invention is more suitable for on-chip application in comparison with the aforementioned prior arts.

In addition, the signal gain of the impedance matching circuit 5 of the present invention is adjustable. When the ratio of the resistor 61 to the resistor 801 (or 811, 821) is changed, the signal gain will be modified as well. Of course, the electric characters of the MOS transistors also need to be modified correspondingly during the semiconductor manufacturing processes so as to keep the ratio $V_x/V_i$ in a suitable value. Because the resistor 61 and the resistor 801 (or 811,821) can be formed in the same semiconductor manufacturing processes, their substantial characters will be the same. And, the variation of the actual resistance values of these resistors 61, 801 (or 811,821) can be precisely controlled within an acceptable inaccuracy range. Moreover, the transistor 60 and the transistors 800, 801, 820 are also formed in the same semiconductor manufacturing processes, so they should also have the same electric characters and resistance values when switched on.

For another example, in order to provide a 50 Ω output impedance by the on-chip impedance matching circuit 5 of the present invention, the resistors 90, 91, 92 can be designed to be 5 Ω, 5 Ω, 45 Ω respectively. And, the resistors 61, 801, 811, 821 are all equal to 2 KΩ. Assuming there are three IC chips which are not manufactured in the same time. Due to the deviations of the semiconductor manufacturing processes, the overall resistance values of these three IC chips have 10% variation (e.g. chip1: −10%, chip2: 0%, chip3: +10%). By employing the on-chip impedance matching circuit 5 of the present invention, the output resistance values (impedances) of these three IC chips can be adjusted as below:

For chip1:
Let the transistor 800 in chip 1 switch on and others switch off, then $$R_{out} = (\text{resistor } 90 + \text{resistor } 91 + \text{resistor } 92) * 90\%$$
$$= (5\Omega + 5\Omega + 45\Omega) * 90\%$$
$$= 49.5\Omega$$

For chip2:
Let transistor 810 in chip 2 switch on and others switch off, then $$R_{out} = (\text{resistor } 91 + \text{resistor } 92) * 100\%$$
$$= (5\Omega + 45\Omega)$$
$$= 50\,\Omega$$

For chip3:
Let transistor 820 in chip 3 switch on and others switch off, then $$R_{out} = \text{resistor } 92 * 110\%$$
$$= 45\Omega * 110\%$$
$$= 49.5\Omega$$

Moreover, the amount of the resistors of the resistor selecting circuit 9 and the amount of the transistors of the feedback selecting circuit 8 can be increased, or the value ranges between the resistors of the resistor selecting circuit 9 can be refined, so as to obtain a more precise output resistance value (impedances) of the IC chip.

It is noted that, the amount of the transistors of the feedback selecting circuit 8 and the amount of the resistors of the resistor selecting circuit 9 can be designed to suit the real needs and are not limited to the above illustrated embodiments nor examples However, it is preferable that the amount of the resistors is equal to the transistors. Such that, the connecting relationship between the transistors and the resistors is relatively simple, that is, any two of the adjacent resistors are connected with a corresponding transistor at a node located therebetween. The overall impedance of the on-chip impedance matching circuit 5 in accordance with the present invention can be precisely adjusted by switching on a certain transistor so as to enable some of the resistors of the resistor selecting circuit 9. Moreover, the output impedance of the on-chip impedance matching circuit 5 is exactly the same as the sum of those enabled resistors, and will not be influenced by the variation of the input signal (input voltage) nor the electric characters of the transistors. As a result, the impedance matching circuit 5 of the present invention is very suitable to be implemented on the IC chip.

To sum up, the present invention discloses an impedance matching circuit which is independent of the input signals and is able to prevent the signal distortion. Moreover, the present invention also discloses a method to precisely adjust the impedance as required. Not only the drawbacks of the prior arts are eliminated, but also a novel circuit and a progressive function are provided.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the sprit of the present invention.

What is claimed is:

1. An impedance matching circuit, comprising:
   a resistor unit for receiving an input signal;
   an OP amplifier circuit having an output terminal and an input terminal which is connected with said resistor unit;
   a feedback selecting circuit which is controllable by a first control voltage, said feedback selecting circuit being connected in parallel with the OP amplifier circuit and also being connected with the resistor unit; and
   a resistor selecting circuit further having an input end connected to said output terminal and an output end for outputting an output signal, said resistor selecting circuit being connected with and controlled by the feedback selecting circuit so as to adjust an impedance of the resistor selecting circuit according to said first control voltage;
   wherein the resistor unit and the feedback selecting circuit are designed in such a manner that the resistor unit is able to compensate an equivalent resistance of the feedback selecting circuit when said first control voltage is applied thereto.

2. The impedance matching circuit of claim 1, wherein the OP amplifier circuit is an OP amplifier which further has an inverting input terminal, a non-inverting input terminal and the output terminal.

3. The impedance matching circuit of claim 2, wherein said resistor unit further comprises a first transistor and a first resistor, said first transistor is controllable by a second control voltage and has a first drain thereof connected to the inverting input terminal of the OP amplifier.

4. The impedance matching circuit of claim 1, wherein the feedback selecting circuit comprises a plurality of switching circuits which are connected with each other in parallel and are controllable by a plurality of said first control voltages respectively, wherein the resistor unit and the switching circuits all have the same electric characters.

5. The impedance matching circuit of claim 4, wherein each switching circuit further comprises a second transistor and a second resistor, wherein each second transistor has a second source connected to the input terminal of the OP amplifier circuit, a second gate for receiving said first control voltage and a second drain connected to one end of the second resistor, wherein another end of the second resistor is connected to the resistor selecting circuit.

6. The impedance matching circuit of claim 4, wherein the resistor selecting circuit further comprises a plurality of third resistors and a plurality of nodes located between said third resistors, wherein each node is connected with one of the switching circuits.

7. The impedance matching circuit of claim 1, wherein the impedance matching circuit is built in an IC chip.

8. The impedance matching circuit of claim 7, wherein the resistor unit and the feedback selecting circuit are made by the same semiconductor manufacturing processes.

9. An impedance matching circuit, comprising:
   a resistor unit for receiving an input signal;
   an OP amplifier having an output terminal and an inverting input terminal which is connected with said resistor unit;
   a feedback selecting circuit comprising at least one switching circuit which is controllable by a first control voltage, said switching circuit being connected in parallel with the OP amplifier and also being connected with the resistor unit; and
   a resistor selecting circuit comprising at least one resistor, said resistor selecting circuit further having an input end connected to said output terminal and an output end for outputting an output signal, said resistor selecting circuit being connected with and controlled by the feedback selecting circuit so as to adjust an impedance of the resistor selecting circuit according to said first control voltage;
   wherein the resistor unit and the switching circuit are designed in such a manner that the resistor unit is able to compensate an equivalent resistance of the switching circuit when said first control voltage is applied thereto.

10. The impedance matching circuit of claim 9, wherein said resistor unit further comprises a first transistor and a first resistor, said first transistor is controllable by a second control voltage and has a first drain thereof connected to the inverting input terminal of the OP amplifier.

11. The impedance matching circuit of claim 10, wherein each switching circuit further comprises a second transistor and a second resistor, wherein each second transistor has a second source connected to the inverting input terminal of the OP amplifier circuit, a second gate for receiving said first control voltage and a second drain connected to one end of the second resistor, wherein another end of the second resistor is connected to the resistor selecting circuit, wherein the first and second transistors are made by the same semiconductor manufacturing processes.

12. The impedance matching circuit of claim 11, wherein the resistor selecting circuit further comprises a plurality of third resistors and a plurality of nodes located between said third resistors, wherein each node is connected with one of the second resistors.

13. The impedance matching circuit of claim 1, wherein the resistor unit, the OP amplifier, the feedback selecting circuit and the resistor selecting circuit are formed on an IC chip by semiconductor manufacturing processes.

14. An impedance matching circuit, comprising:
   an OP amplifier circuit having an inverting input terminal, a non-inverting input terminal and an amplifier output terminal;
   a resistor unit having a first input terminal, a first output terminal, and a first control terminal, said first input terminal thereof being capable of accepting an input voltage, said first control terminal accepting and being controllable by a second control voltage, said first output terminal connecting with the inverting input terminal of the OP amplifier circuit;
   a feedback selecting circuit including a second input terminal, a plurality of second control terminals, and a plurality of second output terminals, said second input terminal thereof connecting with the inverting input terminal of the OP amplifier circuit, said plurality of second control terminals accepting and being controllable by a plurality of first control voltages; and
   a resistor selecting circuit including an input end, an output end, and a plurality of nodes, said input end thereof connecting with the amplifier output terminal of the OP amplifier circuit, each of said plurality of nodes connecting with one of the second output terminals of the feedback selecting circuit.

15. The impedance matching circuit of claim 14, wherein the resistor unit further comprises a first transistor and a first resistor connected in serial, the first control terminal is a first gate of the first transistor, the first output terminal is one end of the first resistor, another end of the first resistor is connected with a first drain of the first transistor, the first input terminal is a first source of the first transistor.

16. The impedance matching circuit of claim 14, wherein the feedback selecting circuit comprises a plurality of switching circuits, each of the switching circuits further comprises a second transistor and a second resistor respectively;
   wherein each of the second control terminals is a second gate of each corresponding second transistor, the second input terminal is connected to all of the second transistors via second sources thereof, each of the second output terminals is one end of each corresponding second resistor, another end of each second resistor is connected with a second drain of each corresponding second transistor.

17. The impedance matching circuit of claim 14, wherein the resistor selecting circuit further comprises a plurality of third resistors connected in serial, said nodes are located between the third resistors.

18. The impedance matching circuit of claim 14, wherein the impedance matching circuit is integrated into an IC chip.

19. The impedance matching circuit of claim 14, wherein the resistor unit comprises at least a first transistor; wherein the feedback selecting circuit comprises a plurality of second transistors; wherein the first and second transistors are made by the same semiconductor manufacturing processes and are substantially having the same electric characters.

20. The impedance matching circuit of claim 14, wherein the feedback selecting circuit comprises a plurality of switching circuits, each of the switching circuits further includes at least a second transistor, the resistor selecting circuit comprises a plurality of third resistors connected in serial;

wherein, by applying a first control voltage to one of the switching circuits, at least one third resistor of the resistor selecting circuit will be enabled according to the first control voltage;

wherein, the sum of the resistance values of the enabled third resistors is an output impedance value of the impedance matching circuit.

* * * * *